US006822890B2

(12) United States Patent
Torjussen et al.

(10) Patent No.: US 6,822,890 B2
(45) Date of Patent: Nov. 23, 2004

(54) METHODS FOR STORING DATA IN NON-VOLATILE MEMORIES

(75) Inventors: Lars Sundell Torjussen, Oslo (NO); Christer Karlsson, Linköping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/410,592

(22) Filed: Apr. 10, 2003

(65) Prior Publication Data

US 2003/0218925 A1 Nov. 27, 2003

(30) Foreign Application Priority Data

Apr. 16, 2002  (NO) ........................................... 20021792

(51) Int. Cl.⁷ .............................................. G11C 11/22
(52) U.S. Cl. ...................................... 365/145; 365/200
(58) Field of Search ................................. 365/145, 200

(56) References Cited

U.S. PATENT DOCUMENTS

| | | | |
|---|---|---|---|
| 5,343,426 A | * 8/1994 | Cassidy et al. | 365/189.02 |
| 5,682,344 A | 10/1997 | Seyyedy | 365/145 |
| 5,748,638 A | 5/1998 | Gunther et al. | 714/719 |
| 5,812,565 A | 9/1998 | Fendt et al. | 714/764 |
| 5,815,431 A | 9/1998 | Chen | 365/145 |
| 5,892,705 A | 4/1999 | Chung | 365/145 |
| 6,201,731 B1 | 3/2001 | Kamp et al. | 365/185.02 |
| 6,211,710 B1 | 4/2001 | Madhu et al. | 365/198 |

FOREIGN PATENT DOCUMENTS

| | | |
|---|---|---|
| DE | 3312873 | 10/1984 |
| EP | 0 803 813 | 10/1997 |
| WO | 00/26783 | 5/2000 |

* cited by examiner

Primary Examiner—M. Tran
(74) Attorney, Agent, or Firm—Jacobson Holman PLLC

(57) ABSTRACT

In methods for storing data in a non-volatile ferroelectric random access memory wherein destructive readout operations are followed by rewrite operations, identical copies of the data are stored in different memory locations that do not have any common word lines or alternative neither common word lines nor common bit lines. A first word line or a segment of a first word line is read in its entirety, said word line or said segment including at least a first copy of the identical copies of data. The data thus read are rewritten to the memory location and in addition transferred from the memory location in question to an appropriate cache location, whereafter subsequent memory locations either in the form of word lines or segments thereof are read, and data rewritten to the cache location. The operation is repeated until all identical copies of the data have been transferred to the cache storage. Subsequently bit errors are detected by comparing the identical copies in a memory control logic circuit, which also may be used for caching readout data copies or alternatively be connected with a separate cache memory. Corrected data are written back to the appropriate memory locations holding bit errors when the latter have been detected.

6 Claims, 6 Drawing Sheets

METHODS FOR STORING DATA IN NON-VOLATILE MEMORIES

FIELD OF THE INVENTION

The present invention concerns methods for storing data in a non-volatile ferroelectric random access memory (FRAM), particularly a memory wherein a ferroelectric memory material is a ferroelectric polymer, wherein memory locations are provided as elements of a matrix and accessed via electrodes forming word and bit lines of the matrix, and wherein destructive read-out operations to the memory locations are followed by rewrite operations.

BACKGROUND OF THE INVENTION

Ferroelectric memories are becoming commercially important because they are non-volatile, can be made at relatively low cost, and can be written to and read at voltages from 1 to 5 volts and at speeds in the order of 10 to 100 nanoseconds, which is typical of conventional DRAM and SRAM computer memories.

Placing ferroelectric material between the plates of a capacitor on a semiconductor substrate causes the capacitor to exhibit a memory effect in the form of charge polarization. When the capacitor is charged with the field lines running in one direction across the capacitor plates, a residual charge polarization remains after the charge is removed from the capacitor plates. If an opposite charge is placed on the capacitor plates, an opposite residual polarization remains. A plot of the applied field voltage across the plates of the capacitor against the polarization of the ferroelectric material between the plates of the capacitor exhibits a classic hysteresis curve as shown in FIG. 1. $P_s$ and $-P_s$ are the spontaneous polarization values whereas $P_r$ and $-P_r$ are the remnant polarization values indicating the polarization in the ferroelectric material at zero field value. In an ideal ferroelectric $P_s$ should equal $P_r$ but these values differ in actual ferroelectrics due to linear dielectric and non-linear ferroelectric behaviour.

Ferroelectric memories utilize a ferroelectric capacitor as the storage medium and an electric field must be placed across the storage capacitor in order to read it. A pulse is applied to the ferroelectric capacitor and the amount of resultant charge is either low if the pulse polarity agreed with the previous one, or the resultant charge is higher if the charge placed on the capacitor is of the opposite polarity of the one last placed across the plates of the capacitor. This minute difference between charge that agreed with the previous memory charge and an opposite charge can be measured to determine what the previous polarization on the ferroelectric capacitor was when it was last written. The reading electric field alters the state of the memory cell in many cases. This means that ferroelectric memories are destructively read-out memories which must include a rewrite function in which the data read out is restored to the memory cell after it has been read. The rewrite operation takes time, and if the memory function is truncated, for instance by a power loss, during or immediately after a cell is read and before the rewrite cycle can be completed, the data of that cell will be lost. Such data losses are not acceptable for non-volatile memories.

A ferroelectric random access memory (RAM) which uses ferroelectric memory cells to store data is disclosed in U.S. Pat. No. 5,682,344. The ferroelectric memory is a static memory in which data stored in the ferroelectric memory cells can be destroyed during read operations. The memory comprises circuitry which latches a current memory address during an access operation and prevents the memory from jumping to a new memory address until the destroyed data has been replaced. The memory also includes circuitry which can detect a transition in address data provided on address inputs.

A circuit including a ferroelectric capacitor that can be used to store the value of nodes of volatile logic elements in a logic circuit is disclosed in U.S. Pat. No. 5,815,431. In this manner, the state of a complex logic circuit, such as a CPU or an I/O device, can be stored in the non-volatile ferroelectric capacitors. After an accidental or planned power outage, the non-volatile ferroelectric capacitors can be used to restore the values of the nodes. Additionally, a planned power loss can be used for saving system power in circuits that are power-consumption sensitive.

An apparatus and method for maintaining non-volatility in a ferroelectric random access memory is disclosed in U.S. Pat. No. 5,892,705. The apparatus for maintaining non-volatility includes a control section for a write-back function, a power source voltage sensing unit for sensing a failure in the power source voltage and providing a power failure signal to the control section, such that the control section completes a write-back cycle before power failure. The power source voltage-sensing unit generates a control signal by sensing a failure in power source voltage, and provides a power failure signal to the control section such that a write-back process is completed before power failure, thereby maintaining non-volatility of the memory device.

In U.S. Pat. No. 6,201,731, the ferroelectric destructive read-out memory system includes a power source, a memory array including a memory cell, and a logic circuit for applying a signal to the memory array. Whenever a low power condition is detected in said power source, a disturb prevent circuit prevents unintended voltages due to the low power condition from disturbing the memory cell. The disturb prevent circuit also stops the operation of the logic circuit for a time sufficient to permit a rewrite cycle to be completed, thereby preventing loss of the data being rewritten.

In U.S. Pat. No. 6,211,710, a circuit for ensuring stabilized configuration information upon power-up is disclosed. In one embodiment, a semiconductor device includes a configuration information stored in a number of non-volatile storage elements (fuse bits). A configuration power-on reset circuit generates a signal for latching the configuration data into volatile configuration registers on power-up. The configuration data signals are generated in response to a power-on reset (POR) pulse, and not latched until a predetermined delay after the POR pulse is terminated. The predetermined delay allows time for the data signals from the fuse bits to "settle." Subsequent POR pulses will not result in another latching action.

European patent application EP 0 803 813 A1 discloses a data-backup apparatus for a semiconductor memory, particularly a non-volatile semiconductor memory, for instance of the type EEPROM (electrical erasable read only memory). The purpose of this apparatus is to prevent data loss or incorrect data if a write operation unintentionally is interrupted, for instance if the power is turned off during a write operation. The semiconductor memory has a plurality of memory locations storing values of variables. A write unit writes a value to a plurality of memory locations in the memory one by one and a read unit reads the values from these memory locations. A coincidence determining means is used to decide whether more than half of the read values from the memory locations in the memory are identical, and assigning means then determines a coincidence value if the coincidence determining means has found that more than half of the values are identical. Thus, a determined coincidence value can be assigned each variable.

SUMMARY OF THE INVENTION

The object of the present invention is to provide methods that ensures a non-volatile storage of data in matrix-addressable memories, particularly ferroelectric memories, and maintain the integrity of the stored data by detecting bit errors in the readout data and effecting a correction thereof.

This object as well as further features and advantages are realized according to the present invention with a first method which is characterized by successive steps for (a) storing a plurality of identical copies of said data in a plurality of memory locations, said memory locations not having any common word lines;

(b) reading a first word line in its entirety, said first word line comprising at least a first copy of said identical copies of said data, rewriting the data read from said first word line back into said first word line and, transferring the data read from said first word line to a memory control logic circuit;

(c) reading a subsequent word line in its entirety, said subsequent word line comprising at least a subsequent copy of said identical copies of said data, rewriting the data read from said subsequent word line back into said subsequent word line, and transferring the data read from said subsequent word line to said memory control logic circuit;

(d) repeating step (c) until said data read from said word lines comprising copies of said identical copies of said data, have been transferred to said memory control logic circuit;

(e) detecting any bit errors by comparing said data read from said word lines comprising copies of said identical copies of said data, bit-wise in said memory control logic circuit; and (f) writing corrected data to the memory cells in said memory locations that hold bit errors, when bit errors have been detected in step (e).

The same object as well as further features and advantages are realized according to the present invention with a second method which is characterized by successive steps for (a) storing a plurality of identical copies of said data in a plurality of memory locations, said memory locations having neither common word lines nor common bit lines;

(b) reading a segment of a first word line, said segment of a first word line comprising at least a first copy of said identical copies of said data, rewriting the data read from said segment of a first word line back into said segment of a first word line, transferring said data read from said segment of a first word line to a first segment of data latches, and retaining said data read from said segment of a first word line in said first segment of data latches;

(c) reading a segment of a subsequent word line, said segment of a subsequent word line comprising at least a subsequent copy of said identical copies of said data, rewriting the data read from said segment of a subsequent word line back into said segment of a subsequent word line, transferring said data read from said segment of a subsequent word line to a subsequent segment of data latches, and retaining said data read from said segment of a subsequent word line in said subsequent segment of data latches;

(d) repeating step (c) until said identical copies of said data have been transferred to said segments of data latches;

(e) transferring said data retained in said segments of data latches to a memory control logic circuit;

(f) detecting any bit errors by comparing said identical copies of said data bit-wise in said memory control logic circuit; and (g) writing corrected data to the memory cells in said memory locations that hold bit errors, when bit errors have been detected in step (f).

In both methods according to the invention the data preferably are timing data for controlling the read and rewrite operations, or redundancy data for identifying redundancy memory cells.

In both methods according to the invention the bit-wise comparison in step (e) can advantageously be replaced with detecting any bit errors by including an error correction code with said data.

BRIEF DESCRIPTION OF THE DRAWINGS

The invention shall now be explained in greater detail with discussions of exemplary embodiments and with reference to the accompanying drawing figures, of which

DETAILED DESCRIPTION OF THE PREFERRED EMBODIMENTS

The present invention concerns related methods expressing the same inventive idea. These methods will now be described in terms of preferred embodiments.

Figure 1:
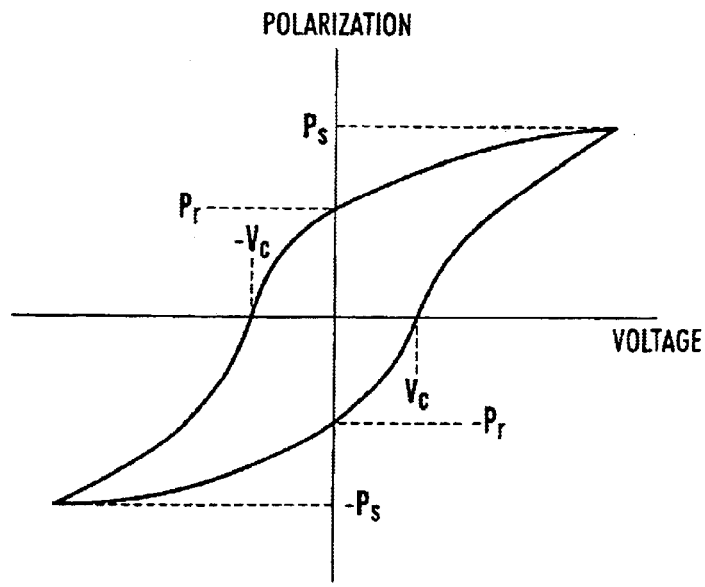
FIG. 1 shows a hysteresis curve of a ferroelectric capacitor as known in the art and mentioned above.
Figure 2:
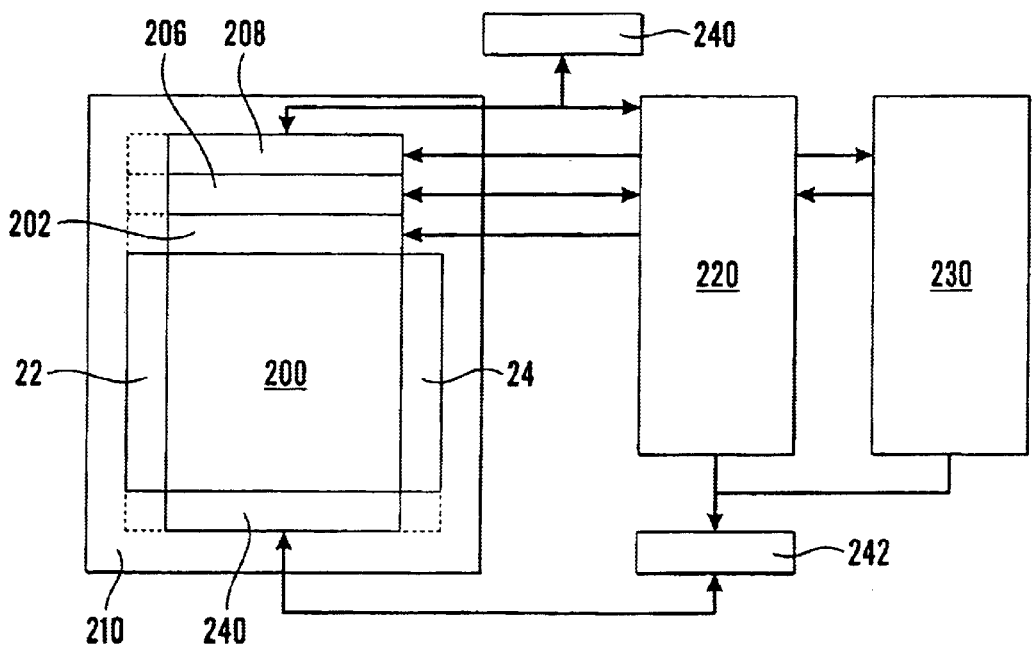
FIG. 2 is a block diagram of a memory circuit wherein the methods according to the invention may be implemented.

FIG. 2 illustrates a simple block diagram that demonstrates the elements of the memory as used with both methods according to the invention. The memory macro 210 comprises a memory matrix or array 200, row and column decoders 22, 202, sense amplifiers 206, data latches 208 and redundant word and bit lines 204, 24. The row and column decoders 22, 202 decode the addresses of memory locations or memory cells which are located at the crossings of the memory array electrodes, i.e. the word lines forming the rows of the memory array and the bit lines forming the columns of the memory macros. Readout of data stored in the memory cells is performed by the sense amplifiers 206 connected to the bit lines. The data latches 208 hold the data until a part thereof or all is transferred to the memory control logic 220. The data read from the memory macro 210 shall have a certain bit error rate (BER) which can be decreased by replacing defective word and bit lines in the memory array 200 with redundant word and bit lines 204, 24. In order to perform error detection the memory macro 210 must have data fields containing error correction code (ECC) information.

A module for the memory control logic 220 provides a digital interface for the memory macro 210 and controls the read and write of the memory array 200. Memory initialisation and logic for replacing defective word and bit lines with redundant word and bit lines 204, 24 will be found in the memory control logic 220 as well.

The device controller 230 connects the memory control logic 220 to external bus standards. The ECC unit 240 performs error correction on the full memory array 200. It can be a simple error detection or include error correction as well. The charge pumps 242 generate some of the voltages needed to read and write to the memory cells. A separate clock input, given by the device controller 230 via an oscillator (not shown), will be used by the charge pumps 242 for charge pumping in order to remain independent of the bit rate of the application using the memory macro 210.

Figure 3A:
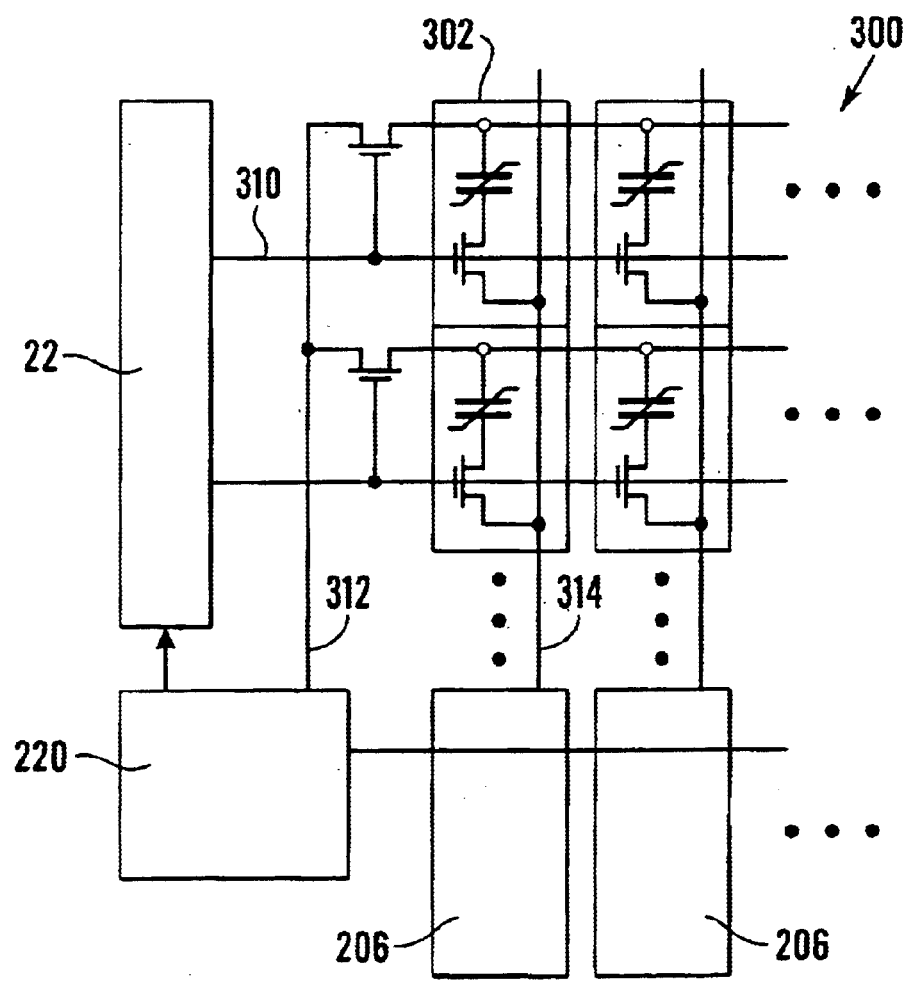
FIG. 3a is a schematic block diagram of an array of ferroelectric memory cells connected to sense amplifiers and which can be used with the methods according to the invention.

FIG. 3a shows a ferroelectric memory device 300 comprising a matrix or array of ferroelectric memory cells 302. Each memory cell comprises one ferroelectric capacitor and one access control transistor, but there may well be arrangements with two capacitors and two transistors. In the first case the memory macro then is an active matrix-addressable memory device of the type 1T-1C, while in the other case it is of the type 2T-2C. A memory cell 302 is accessed by an enabling word line 310 and is subsequently read by a pulsing drive line 312. Sense amplifiers 206 provided at the end of each bit line 314 generate data out signals. The sense amplifiers also include data regeneration circuits for rewriting data to the ferroelectric memory cells 302. A row decoder 22 decodes a part of the incoming address signals into word line selection signals and the memory control logic 220 generates a sequence of timing signals required for operating the memory array 200.

Figure 3B:
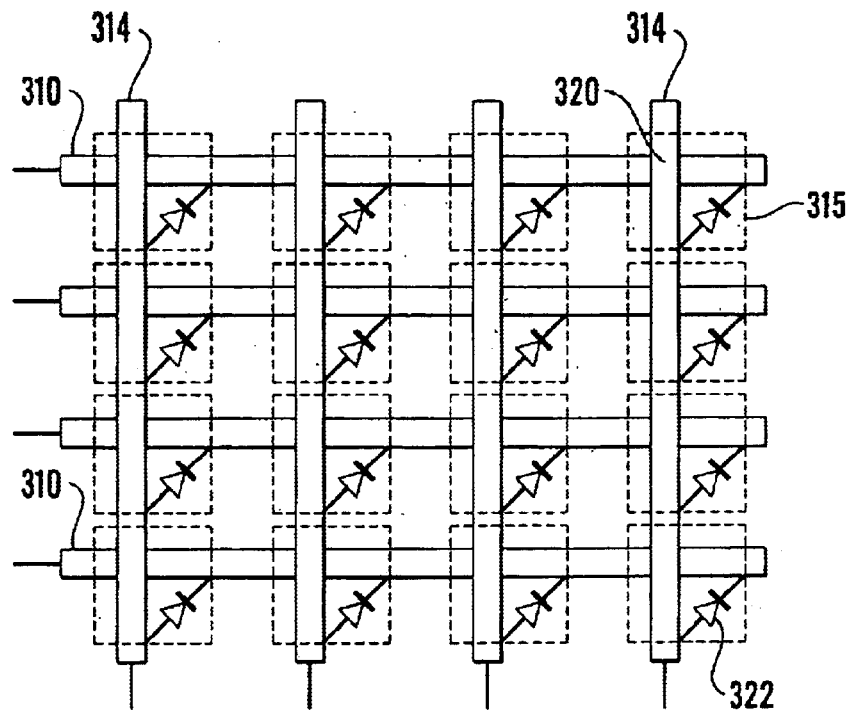
FIG. 3b is a schematic block diagram of an array similar to the one in FIG. 3a and comprising ferroelectric memory cells with diodes between the electrodes in the crossings thereof.

FIG. 3b shows a memory array 200 comprising word line 310 and bit line 314 electrodes. A ferroelectric insulating material is located between these electrodes which therefore do not connect electrically or physically. The ferroelectric material could, however, also be provided above the electrodes, i.e. the word and bit lines, in contact therewith, but beyond that the word and bit lines shall be mutually insulated by a non-ferroelectric dielectric. -At each intersection 320 between the word lines 310 and bit lines 314, diodes 322 are generated. The ferroelectric material together with the word and bit lines 310;314 forms ferroelectric capacitors or memory cells 315 with the word and bit lines 310;314 as the plates of the capacitors.

Figure 4:
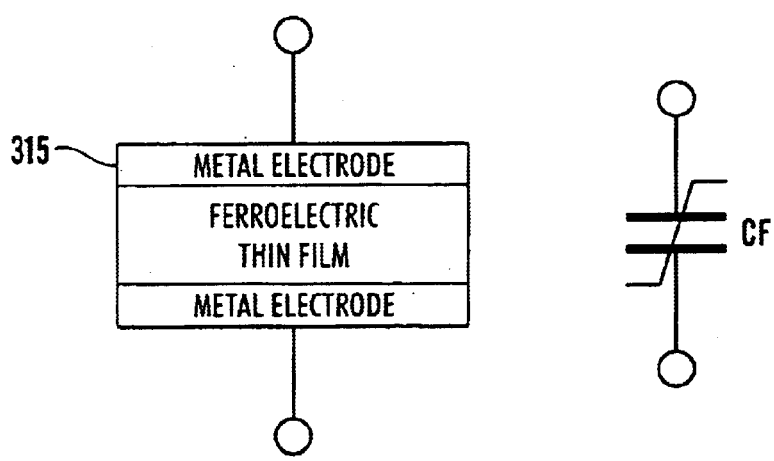
FIG. 4 shows two diagrams of a ferroelectric thin-film capacitor as used in ferroelectric memory devices.

FIG. 4 illustrates a typical structure and a commonly used symbol for a ferroelectric thin film capacitor 315. The symbol was also used in the schematic block diagram in FIG. 3a as mentioned above. A ferroelectric capacitor of this kind has metallic conductive plates separated by about 50 nm to 100 micrometers of a ferroelectric material constituting the dielectric of the capacitor.

In a non-volatile passive matrix memory system as described above some data, such as configuration data, are very important and need to be protected from a power loss. Timing data for controlling read and rewrite operations as well as redundancy data for identifying redundant memory cells are examples thereof, and if these data get lost, that could render the entire memory useless. Data of this kind could be permanently stored in e.g. fused cells, i.e. fuses melted by lasers, but this comports rather large area penalties. Therefore, important data can be stored in destructive read-out memory cells anyway if other measures are taken to maintain their safety.

Figure 5:
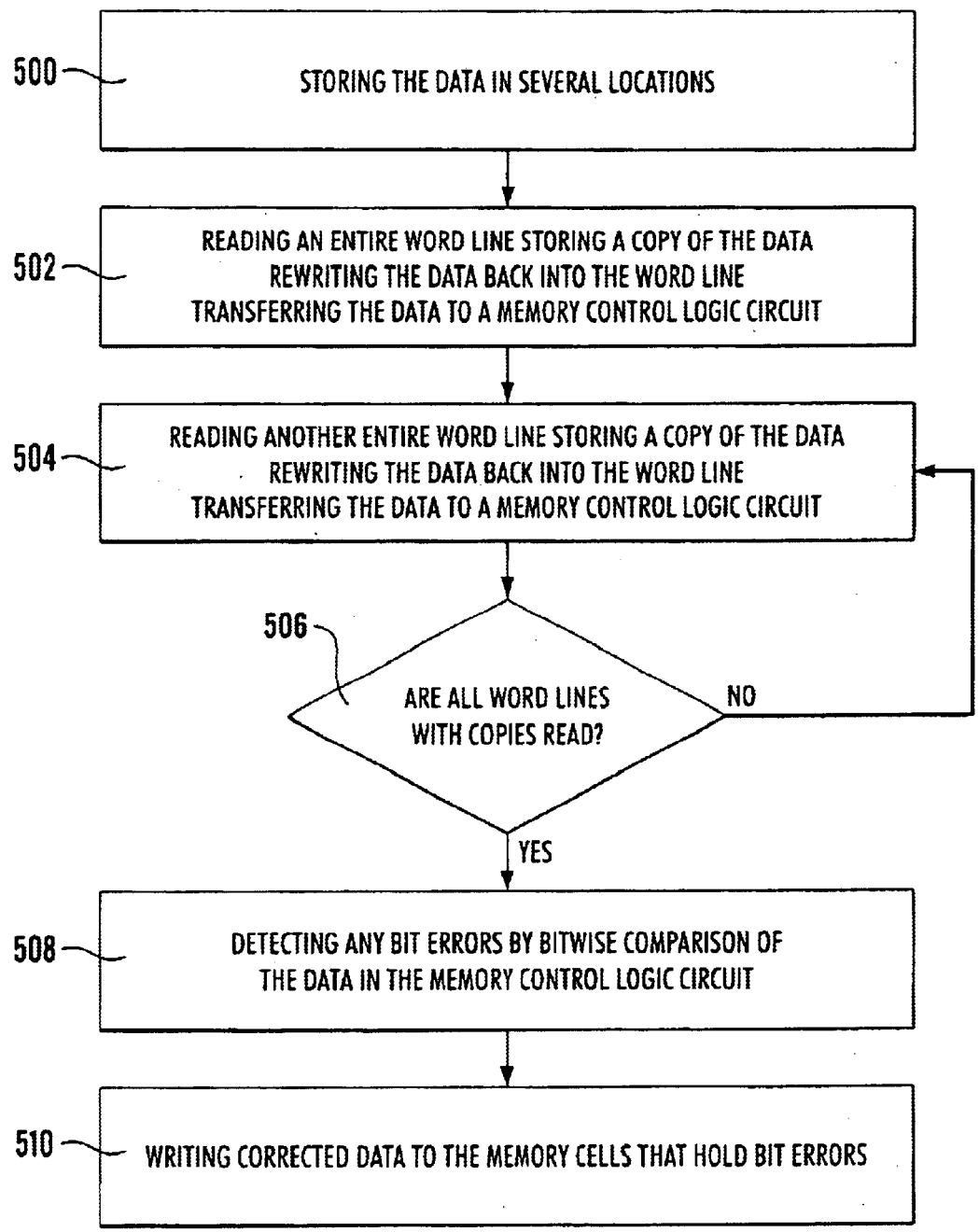
FIG. 5 is a flow chart of a first method according to the invention.

FIG. 5 presents in the form of a flow diagram the first method of the present invention, which solves the problem of having important data eradicated by e.g. a power failure. In step 500, the data that require special attention is stored in several locations in the memory array 200. If some of these locations are defective the redundant word and bit lines 204, 24 are used instead. Whenever the data is about to be used, or on a regular basis, the word lines where these data are stored 700 are read, followed by a rewrite, also known as write-back, automatic in most cases, and transferred to the memory control logic 220 in steps 502 and 504. The number of instances of said data will be around four to ten and some form of counter will in step 506 make sure that all instances are read. Three copies is obviously too little since a power failure in combination with a bit error could cause fatal damage. The different instances of the data are compared in step 508 bit by bit. Another option is to use an ECC unit 240 which requires ECC data to be stored together with the data itself. Finally, in step 510 the portions of the data that were found to be incorrect are corrected and written to the memory cells 302;315 holding the erroneous data.

Figure 6:
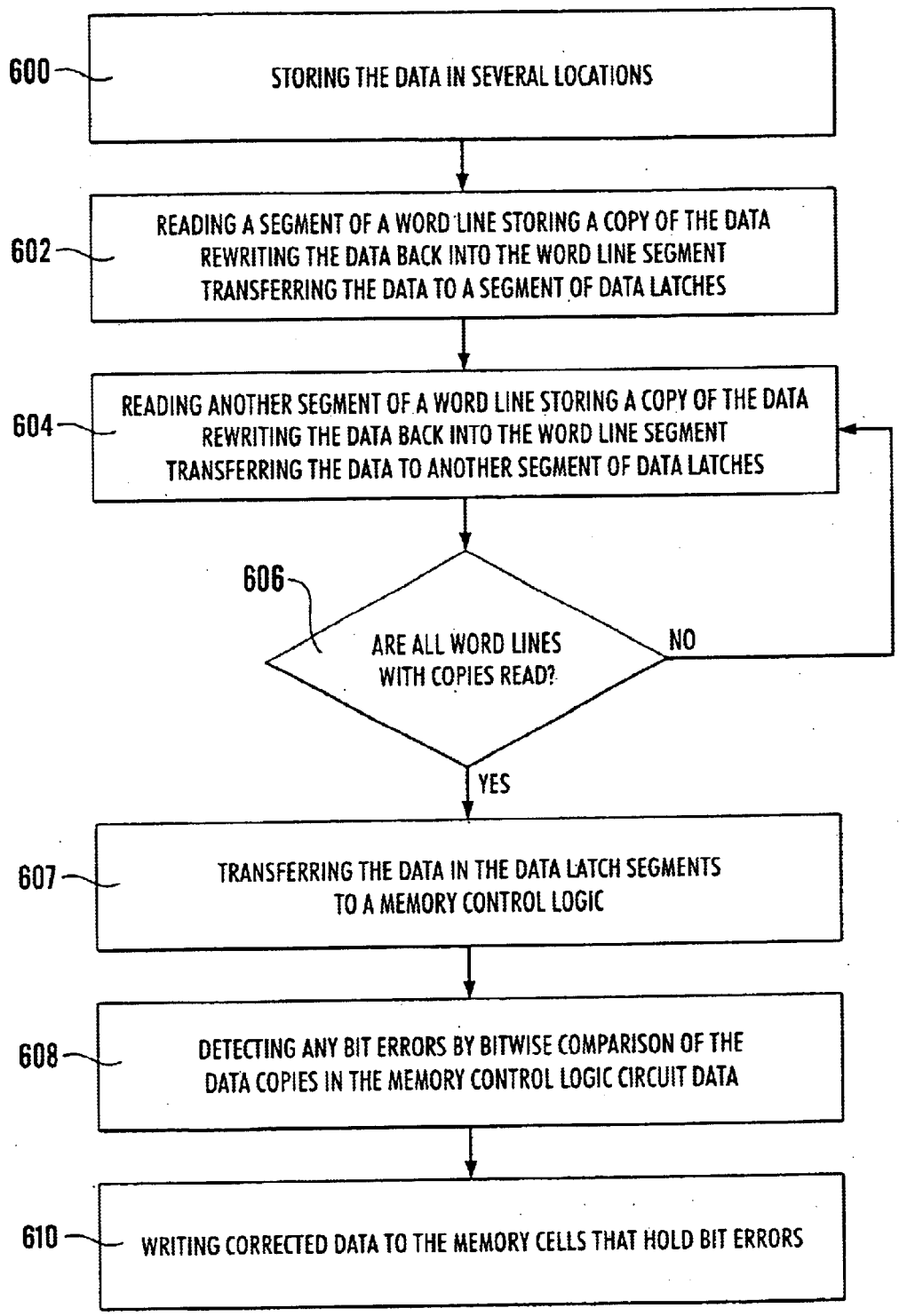
FIG. 6 is a flow chart of a second method according to the invention.

The amount of data that needs to be protected in this way may be quite limited and the word lines 310 used for safety storage can be quite long. This leads to an inefficient use of the memory array 200. In order to remedy this problem the second method according to the invention could be used. It is shown in the flow diagram in FIG. 6 and will ensure that smaller portions of the data deemed important are transferred and that these portions are transferred to data latches 208 in steps 602 and 604. This results in memory cells 302;315 being freed up for other data since the entire word lines 310 no longer have to hold identical data. Steps 606, 608 and 610 correspond to the steps 506, 508 and 510 in FIG. 5 with the only difference that less data are handled. However, a step 607 must be inserted between steps 606 and 608 in order to have the data stored in the data latches 208 transferred to the memory control logic 220. As a result, memory cells in the memory control logic 220 do not need to store as much data since there is no data transfer in steps 602 and 604. Thus the area cost is reduced and similarly the requirement on the data processing capabilities for performing the error detection are reduced.

Figure 7:
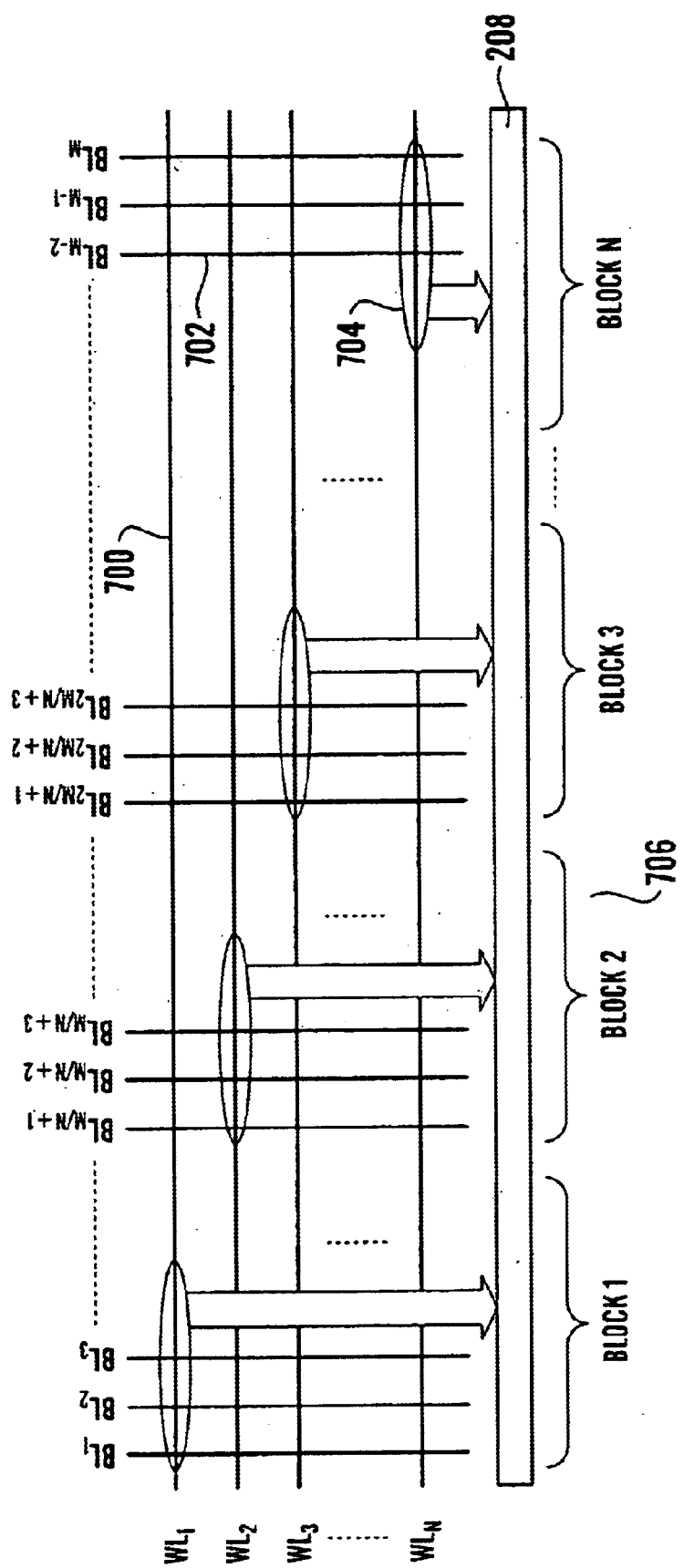
FIG. 7 is a diagram of a memory array as used with a preferred embodiment of the second method according to the invention.

Bit lines 314 are sometimes shorted and data is then stored in redundant bit lines 24. An unexpected shortage problem may eradicate important data. Although a smaller problem, it can be circumvented by storing the important data on different bit lines 314 as well as on different word lines 310. This variant of the second method of the invention is rendered in FIG. 7, which shows word lines 700 and bit lines 702 for memory cells 704 storing important data 704. These copies of important data constitute data blocks 706, and are transferred to storage elements such as the data latches 208 in accordance with the second method of the invention as described above in connection with FIG. 6.

Persons skilled in the art will realize that the methods according to the invention can be used with active as well as passive matrix-addressable electric memory devices and handle bit errors which are generated in addressing operation on both types. But as the readout operation is destructive and hence requires a write-back or rewrite, it will in any case of particular importance to prevent the loss of data content due to bit errors which are generated in the rewrite operation which is required for restoring the destructively readout data.

What is claimed is:

1. A method for storing data in a non-volatile ferroelectric random access memory (FRAM), particularly a memory wherein a ferroelectric memory material is a ferroelectric polymer, wherein memory locations are provided as elements of a matrix and accessed via electrodes forming word and bit lines of the matrix and wherein destructive read-out operations to the memory locations are followed by rewrite operations, the method being characterized by successive steps for (a) storing a plurality of identical copies of said data in a plurality of memory locations, said memory locations not having any common word lines;

(b) reading a first word line in its entirety, said first word line comprising at least a first copy of said identical copies of said data, rewriting the data read from said first word line back into said first word line and, transferring the data read from said first word line to a memory control logic circuit;

(c) reading a subsequent word line in its entirety, said subsequent word line comprising at least a subsequent copy of said identical copies of said data, rewriting the data read from said subsequent word line back into said subsequent word line, and transferring the data read from said subsequent word line to said memory control logic circuit;

(d) repeating step (c) until said data read from said word lines comprising copies of said identical copies of said data, have been transferred to said memory control logic circuit;

(e) detecting any bit errors by comparing said data read from said word lines comprising copies of said plurality of identical copies of said data, bit-wise in said memory control logic circuit; and (f) writing corrected data to the memory cells in said memory locations that hold bit errors, when bit errors have been detected in step (e).

2. The method according to claim 1, characterized by said data being timing data for controlling the read and rewrite operations, or redundancy data for identifying redundant memory cells.

3. The method according to claim 1, characterized by replacing the bit-wise comparison in step (e) with detecting any bit errors by including an error correction code (ECC) with said data.

4. A method for storing data in a non-volatile ferroelectric random access memory (FRAM), particularly a memory wherein a ferroelectric memory material is a ferroelectric polymer, wherein memory locations are provided as elements of a matrix and accessed via electrodes forming word and bit lines of the matrix, and wherein destructive read-out operations to the memory locations are followed by rewrite operations, the method being characterized by successive steps for (a) storing a plurality of identical copies of said data in a plurality of memory locations, said memory locations having neither common word lines nor common bit lines;

(b) reading a segment of a first word line, said segment of a first word line comprising at least a first copy of said identical copies of said data, rewriting the data read from said segment of a first word line back into said segment of a first word line, transferring said data read from said segment of a first word line to a first segment of data latches, and retaining said data read from said segment of a first word line in said first segment of data latches;

(c) reading a segment of a subsequent word line, said segment of a subsequent word line comprising at least a subsequent copy of said identical copies of said data, rewriting the data read from said segment of a subsequent word line back into said segment of a subsequent word line, transferring said data read from said segment of a subsequent word line to a subsequent segment of data latches, and retaining said data read from said segment of a subsequent word line in said subsequent segment of data latches;

(d) repeating step (c) until said identical copies of said data have been transferred to said segments of data latches;

(e) transferring said data retained in said segments of data latches to a memory control logic circuit;

(f) detecting any bit errors by comparing said identical copies of said data bit-wise in said memory control logic circuit; and (g) writing corrected data to the memory cells in said memory locations that hold bit errors, when bit errors have been detected in step (f).

5. The method according to claim 4, characterized by said data being timing data for controlling the read and rewrite operations, or redundancy data for identifying redundant memory cells.

6. The method according to claim 4, characterized by replacing the bit-wise comparison in step (e) with detecting any bit errors by including an error correction code (ECC) with said data.

* * * * *